United States Patent
Yen et al.

(10) Patent No.: US 9,098,256 B2
(45) Date of Patent: Aug. 4, 2015

(54) MOTHERBOARD MODULE AND ELECTRONIC APPARATUS USING THE SAME

(75) Inventors: Heng-Yu Yen, Taipei (TW); Pai-Ching Huang, Taipei (TW)

(73) Assignee: ASUSTeK COMPUTER INC., Taipei (TW)

( * ) Notice: Subject to any disclaimer, the term of this patent is extended or adjusted under 35 U.S.C. 154(b) by 239 days.

(21) Appl. No.: 13/603,424

(22) Filed: Sep. 5, 2012

(65) Prior Publication Data

US 2013/0094140 A1    Apr. 18, 2013

(30) Foreign Application Priority Data

Oct. 17, 2011 (CN) .......................... 2011 1 0314364

(51) Int. Cl.
*H05K 7/20* (2006.01)
*G06F 1/20* (2006.01)

(52) U.S. Cl.
CPC .............. *G06F 1/20* (2013.01); *H05K 7/20145* (2013.01)

(58) Field of Classification Search
USPC ............... 361/679.48–679.51, 690, 694–695, 361/719; 454/184
See application file for complete search history.

(56) References Cited

U.S. PATENT DOCUMENTS

| | | | |
|---|---|---|---|
| 5,822,188 A * | 10/1998 | Bullington | 361/695 |
| 6,155,920 A * | 12/2000 | Pan et al. | 454/184 |
| 6,407,917 B1 * | 6/2002 | Craft et al. | 361/690 |
| 7,120,018 B2 * | 10/2006 | Shen et al. | 361/695 |
| 7,256,993 B2 * | 8/2007 | Cravens et al. | 361/690 |
| 7,408,773 B2 * | 8/2008 | Wobig et al. | 361/695 |
| 7,474,528 B1 * | 1/2009 | Olesiewicz et al. | 361/695 |
| 7,760,498 B2 * | 7/2010 | Shan et al. | 361/695 |
| 8,081,453 B2 * | 12/2011 | Sun | 361/690 |
| 2004/0095719 A1 * | 5/2004 | Rong-Yao | 361/687 |
| 2012/0268890 A1 * | 10/2012 | Stock et al. | 361/679.53 |

FOREIGN PATENT DOCUMENTS

| | | | | |
|---|---|---|---|---|
| CN | 2621311 | | 6/2004 | |
| CN | 2722320 | | 8/2005 | |
| JP | 02121397 | A * | 5/1990 | ............... H05K 7/20 |
| JP | 05126352 | A * | 5/1993 | ............... F24F 1/00 |

* cited by examiner

*Primary Examiner* — Robert J Hoffberg
(74) *Attorney, Agent, or Firm* — Jianq Chyun IP Office

(57) ABSTRACT

The disclosure provides a motherboard module, which includes a motherboard, a cover, a plurality of raised posts and a plurality of plates. The cover covers the motherboard thereon and a first space is formed by the cover and the motherboard. The raised posts are disposed in the first space. The plates are detachably assembled to the raised posts and connected between any two adjacent raised posts so as to partition the first space into a plurality of second spaces. The plates and the raised posts can restrict the heat generated by the heat sources at different limited areas, which is advantageous for the cooling air-flow to cool the heat sources and the motherboard module thereby has better cooling performance.

18 Claims, 9 Drawing Sheets

MOTHERBOARD MODULE AND ELECTRONIC APPARATUS USING THE SAME

CROSS-REFERENCE TO RELATED APPLICATION

This application claims the priority benefit of China application serial no. 201110314364.3, filed on Oct. 17, 2011. The entirety of the above-mentioned patent application is hereby incorporated by reference herein and made a part of this specification.

BACKGROUND OF THE INVENTION

1. Field of the Invention

The disclosure relates to a motherboard module.

2. Description of Related Art

In recent years, with the rapid development of computer technology, computer operation speed continues to increase, and the heat generated by the electronic components inside a computer host also increases with the computer operation speed. In order to prevent the electronic components inside the computer host from overheating, which would lead to temporary or permanent failure of the electronic components, it's becoming important to provide the electronic components inside the computer with adequate cooling performance.

SUMMARY OF THE INVENTION

Accordingly, the disclosure is directed to a motherboard module with a detachable flow-guiding structure. The flow-guiding structure is modular structure, and by changing the modular layout and the direction, the cooling efficiency is advanced. The flow-guiding structure herein is disposed between the motherboard and a cover. In particular, the flow-guiding structure can be disposed on the motherboard or the cover.

The disclosure provides a motherboard module, which includes a motherboard, a cover, a plurality of raised posts and a plurality of plates. The cover covers the motherboard thereon and a first space is formed between the cover and the motherboard. The raised posts are disposed in the first space. The plates are detachably assembled to the raised posts and connected between any two adjacent raised posts so as to partition the first space into a plurality of second spaces. The disclosure further discloses an electronic apparatus, which includes a chassis and the above-mentioned motherboard module disposed in the chassis.

Based on the description above, by using the raised posts disposed in the first space and the detachable plates of the motherboard module, a plurality of air flowing channels are formed in the first space and the plates can serve as heat-isolating baffles of heat sources. The plates and the raised posts are able to guide the cooling air-flow passing through the electronic components to be cooled and restrict the heat generated by the heat sources at local areas, which is advantageous for the cooling air-flow to cool the heat sources and the motherboard module thereby has better cooling performance.

Other objectives, features and advantages of the present disclosure will be further understood from the further technological features disclosed by the embodiments of the present disclosure wherein there are shown and described preferred embodiments of this disclosure, simply by way of illustration of modes best suited to carry out the disclosure.

DESCRIPTION OF THE EMBODIMENTS

Figure 1:
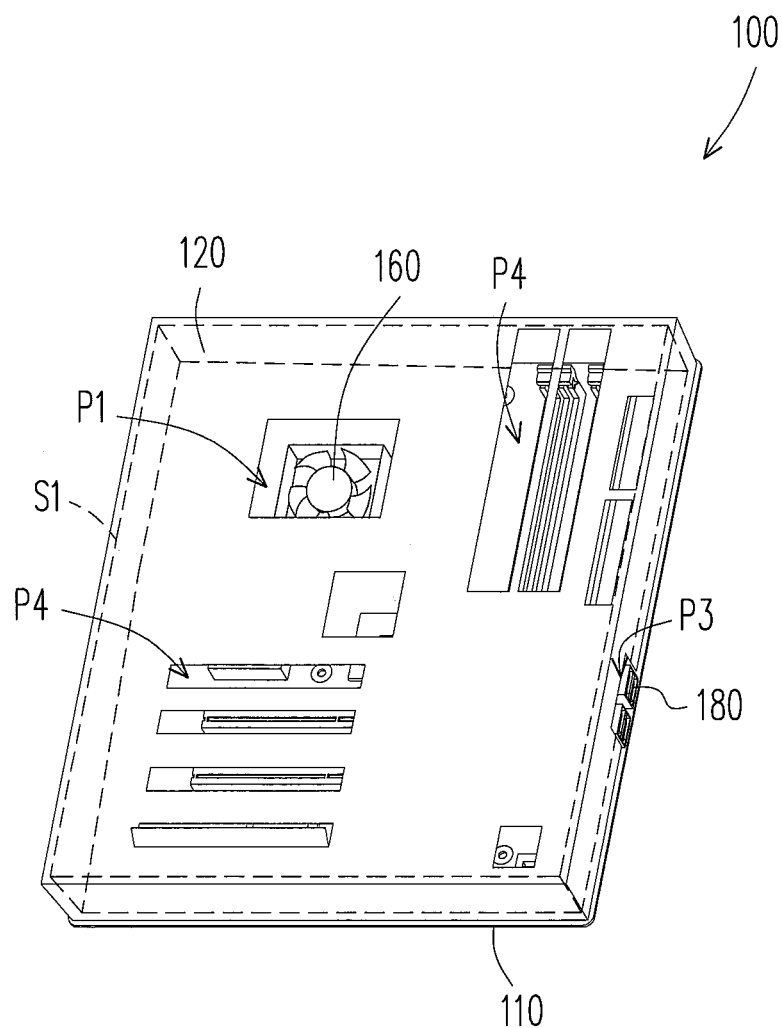
FIG. 1 is a schematic diagram of a motherboard module according to first embodiment of the disclosure.
Figure 2:
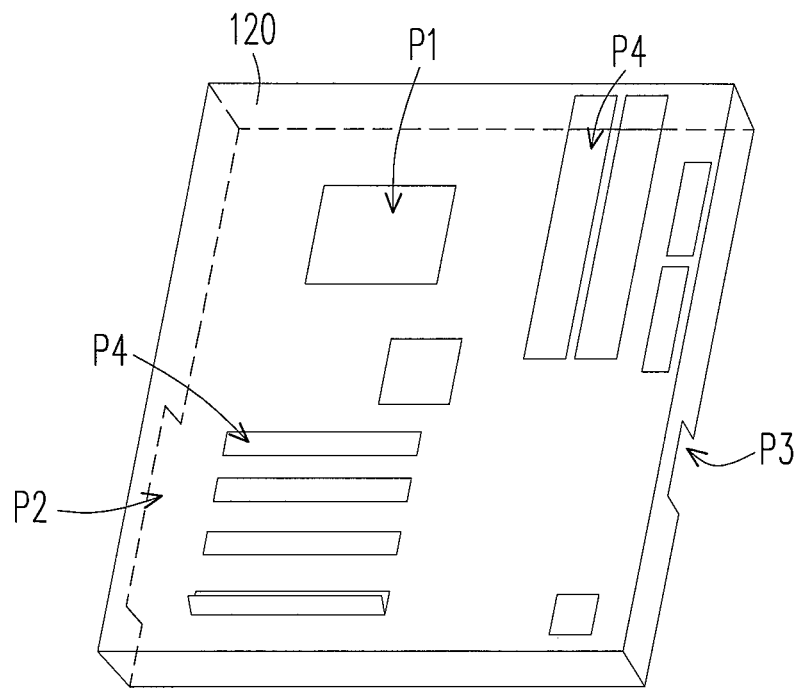
FIG. 2 is an exploded diagram of the motherboard module of FIG. 1.
Figure 2:
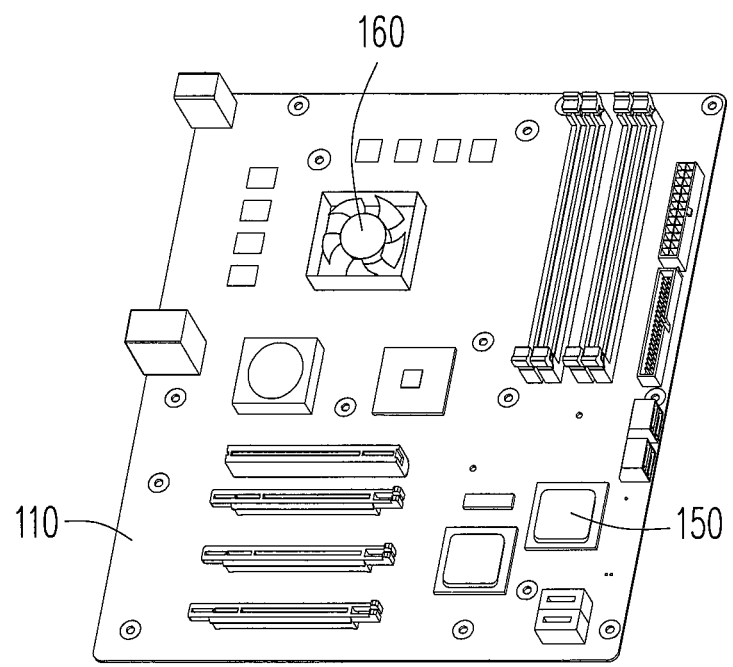
Figure 3:
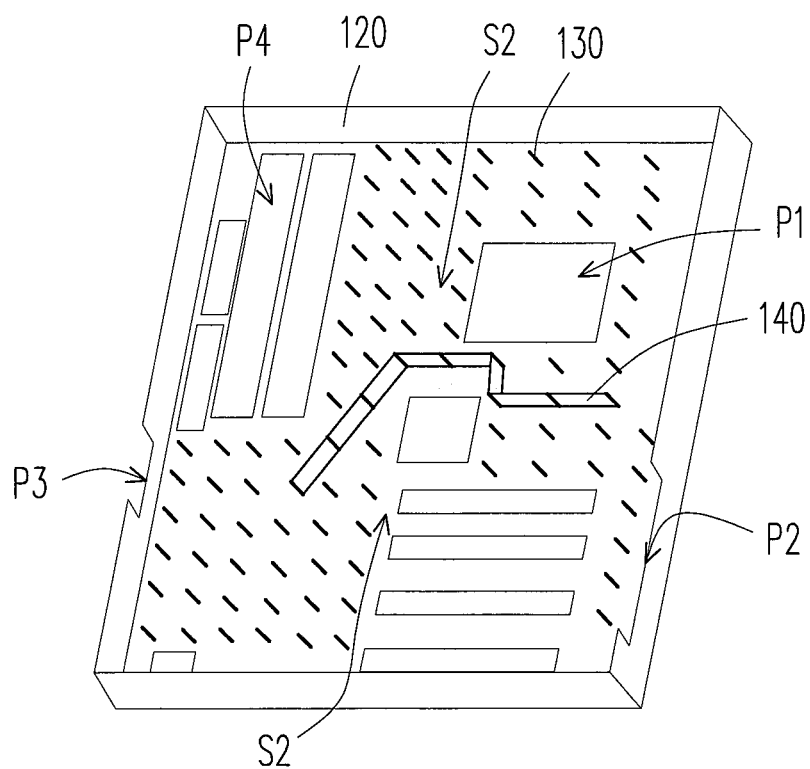
FIG. 3 is a diagram of the cover in the motherboard module of FIG. 2 in another angle of view.

FIG. 1 is a schematic diagram of a motherboard module according to first embodiment of the disclosure, FIG. 2 is an exploded diagram of the motherboard module of FIG. 1, and FIG. 3 is a diagram of the cover in the motherboard module of FIG. 2 in another angle of view. Referring to FIGS. 1-3, in an embodiment, the motherboard module 100 includes a motherboard 110, a cover 120, a plurality of raised posts 130, a plurality of plates 140 and a plurality of electronic components 150 disposed on the motherboard 110. Although in the embodiment, the electronic components 150 are multiple ones, but the disclosure does not limit the quantity of the electronic components 150, and they can be south-bridge chip, north-bridge chip, network chip, graphic processing unit, audio chip, capacitor, resistor, or other relevant parts disposed on the motherboard 110, which the disclosure is not limited to.

The cover 120 covers the motherboard 110 thereon and together with the motherboard 110 forms a first space S1. The cover 120 herein can cover the motherboard 110 and the electronic components 150 on the motherboard 110 so as to provide the motherboard 110 with a succinct appearance. Moreover, the cover body 120 can also be designed with appropriate riffled figures, patterns or other decorations thereon to further make the appearance of the motherboard module 100 nicer. After the cover 120 covers the motherboard 110 and the electronic components 150, the user will not accidentally touch many sharps to get injured and the electronic components 150 will not contact the human-body or other conductive objects so as to reduce the probability of electric shock with the user or damage of the electronic components 150.

In an embodiment, the electronic components 150 are located in the first space S1 between the cover 120 and the motherboard 110 and therefore the heat generated by the electronic components 150 must be properly expelled to avoid the heat burden of the motherboard module 100, in which the heat burden is increased by the cover 120 due to hindering the regular heat-dissipating. The heats generated by the heat sources, i.e., each of the electronic components 150, are not completely the same; in fact, they are somehow different from each other depending on the usage of the motherboard module 100. In this regard, in addition to expelling the heat, the disclosure should consider how to avoid the inter-affecting of the heats generated by different electronic components 150.

Figure 4A:
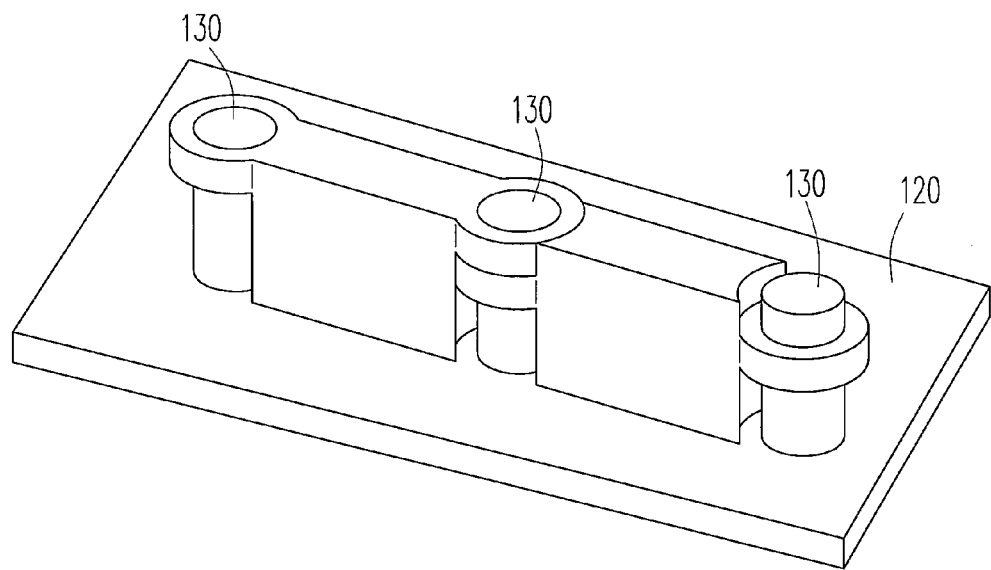
FIG. 4A is a diagram showing the assembling of the plates and the raised posts on the cover of FIG. 3.
Figure 4B:
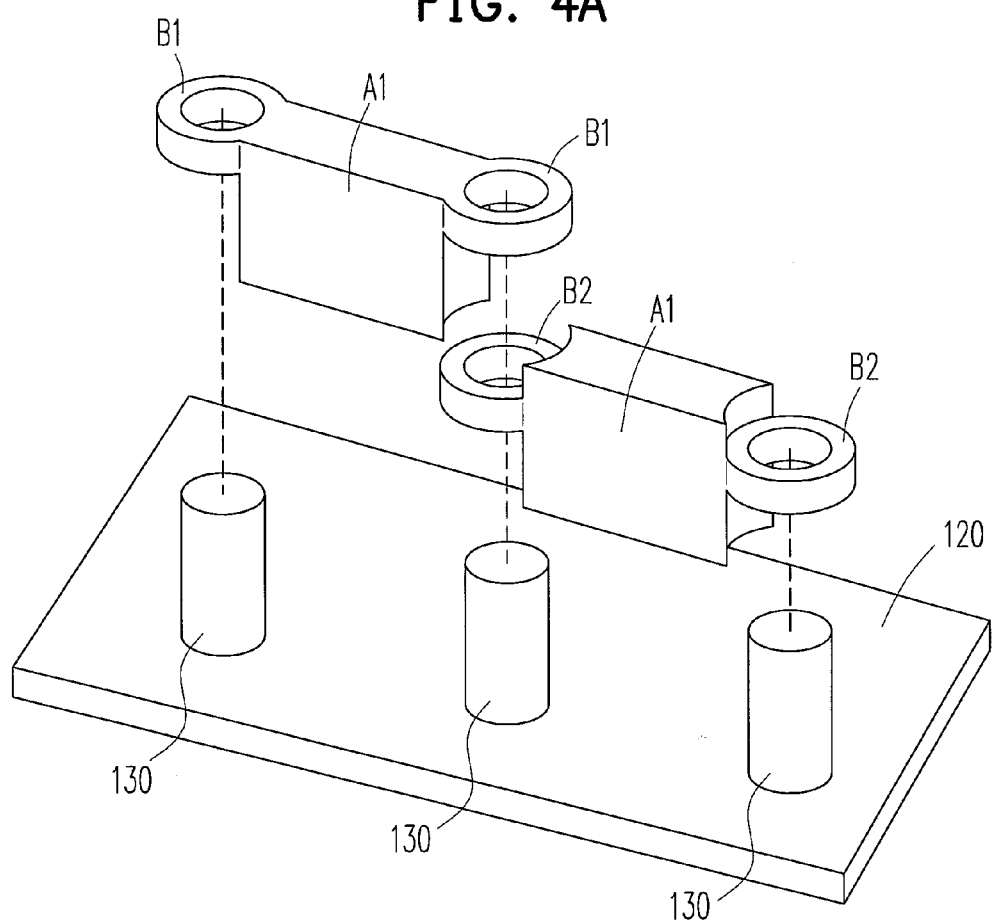
FIG. 4B is an exploded diagram of the plates and the raised posts of FIG. 4A.

FIG. 4A is a diagram showing the assembling of the plates and the raised posts on the cover of FIG. 3 and FIG. 4B is an exploded diagram of the plates and the raised posts of FIG. 4A. Referring to FIGS. 3, 4A and 4B, in an embodiment, the raised posts 130 can be arranged in array on the cover 120 or arranged in array on the motherboard. The plates 140 are respectively detachably assembled to the raised posts 130 so that each of the plates 140 is connected between any two adjacent raised posts 130 and the plates 140 can form a modular baffle structure on the cover 120. As a result, the first space S1 is partitioned into a plurality of second spaces S2 by the modular baffle structure (in the figures, as an exemplary implementation, only partial plates 140 form a baffle structure).

In the embodiment, the plates 140 can be made of plastic or rubber with flexibility, so that when the cover 120 covers the motherboard 110 with interfering the electronic components 150, the cover 120 does not damage the electronic components 150. However, the above-mentioned materials of the plates 140 are example only, which the disclosure is not limited to.

Figure 5:
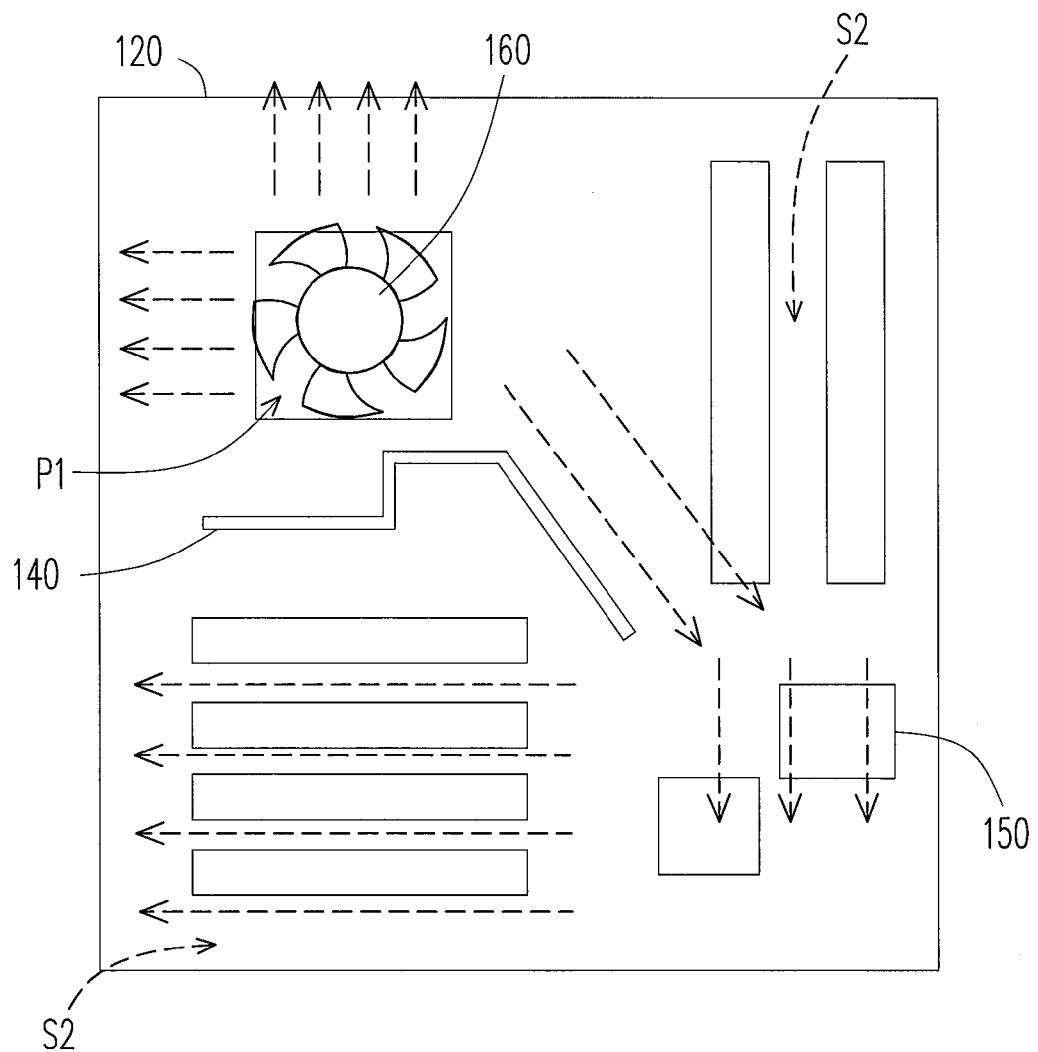
FIG. 5 is a top view diagram of the motherboard module of FIG. 1.

FIG. 5 is a top view diagram of the motherboard module of FIG. 1, in which arrows represent air flowing directions in the spaces. Referring to FIGS. 1 and 5, in the embodiment, the cover 120 further includes a plurality of openings P1, P2, P3 and P4, in which the opening P4 is able to make the user conveniently install the electronic components 150 (for example, expansion card) onto the motherboard 110; the opening P3 is able to expose a connector 180 out of the cover 120 so that the position of the connector 180 can be at a glance and the user can easily electrically connect an external device (not shown) to the motherboard 110; the openings P1 and P2 can serve as an outlet and an inlet of the cooling air-flow of the motherboard module 100.

In more details, the motherboard module 100 further includes a fan 160 disposed on the motherboard 110 and facing the opening P1 to pump external air into the first space S1 via the opening P1 for producing a cooling air-flow. In order to make the cooling air-flow flowing through the electronic components 150 to be heat-dissipated, the plates 140 can be assembled to the corresponding raised posts 130 to form a baffle structure. By using the second spaces S2 formed by the partition of the baffle structure, a plurality of air flowing channels are formed, which enables guiding the cooling air-flow from the outlet of the fan 160 to the electronic components 150, and then, the cooling air-flow flows out from the opening P2 of the cover 120 for cooling.

As description above, since the heats generated by the electronic components 150 are different depending on the usage of the motherboard 110, the above-mentioned baffle structure does not stay unchanged. However the plates 140 of the disclosure are detachably assembled onto different raised posts 130, it provides the user with a preference that when the usage state of the motherboard 110 is changed, the baffle structure can be accordingly revised by the user according to the present heats generated by the electronic components 150 (i.e., changing the channels of guiding the cooling air-flow). As a result, the motherboard module 100 of the disclosure has better adaptation.

In an embodiment, the baffle structure with different arrangement types can be directly formed on the cover, and in adaption to different motherboards or different electronic components, there are the corresponding cover and baffle structure to enable the motherboard module having better cooling efficiency.

Figure 6:
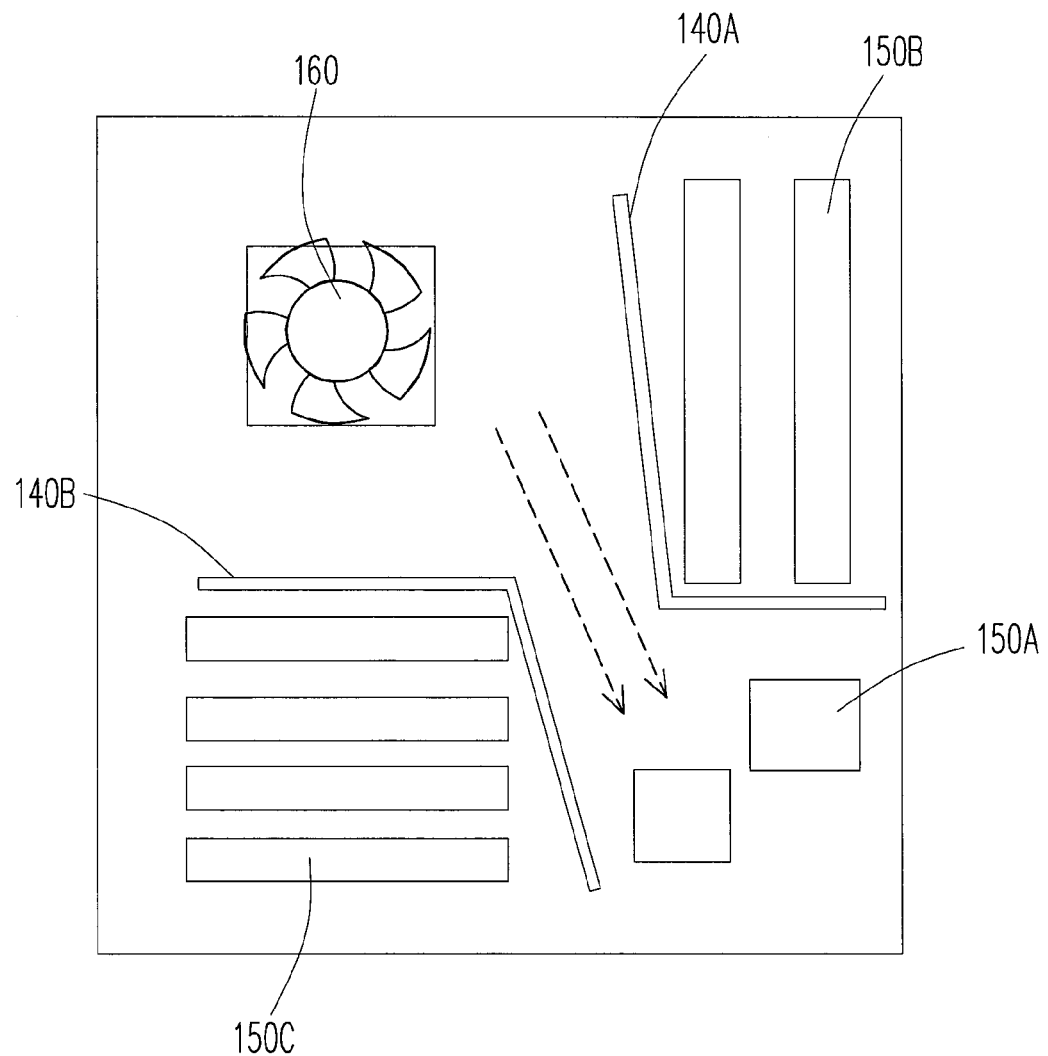
FIG. 6 is a top view diagram of a motherboard module according to second embodiment of the disclosure.

FIG. 6 is a top view diagram of a motherboard module according to second embodiment of the disclosure. Referring to FIG. 6, since the heat generated by each of the electronic components is different from each other, in the embodiment, the above-mentioned baffle structure can also serve as an isolating structure to prevent the heat spreading. For example, the heat generated by the electronic component 150A of the embodiment is larger than the heat of the electronic component 150B or 150C. At the time, the electronic component 150A of the embodiment can be considered as a heat source in the space, and therefore, in addition to using the plates 140A and 140B to respectively form a baffle structure so as to guide the cooling air-flow to the electronic component 150A for cooling, the above-mentioned baffle structures formed by the plates 140A and 140B can further hinder transmitting the heat generated by the electronic component 150A to the electronic components 150B and 150C to increase the heat burdens at the places the electronic components 150B and 150C are located at. In other words, the baffle structures formed by the plates 140A and 140B can restrict the electronic component 150A serving as a heat source in the enclosed sub-space and produce effective heat-isolating efficiency for the electronic components 150B and 150C in other sub-spaces.

Referring to FIGS. 4A and 4B, the plates 140A and 140B respectively have a plate body A1 and two bushing portions B1 and B2 at the two opposite sides of the plate body, in which the bushing portions B1 and B2 are configured to bush any two adjacent raised posts 130, so that the plate body A1 can be connected between two adjacent raised posts 130. It should be noted that in order to provide various combinations of the plates and the raised posts, the bushing portions can have difference heights relatively to the plate body A1 depending on the usage conditions. Taking FIGS. 4A and 4B as an example, by using the difference between the heights of the bushing portions B1 and B2 relatively to the bottom of the plate body A1, the plates 140A and 140B can function in association with each other when they are bushed on the same raised post 130.

Figure 7A:
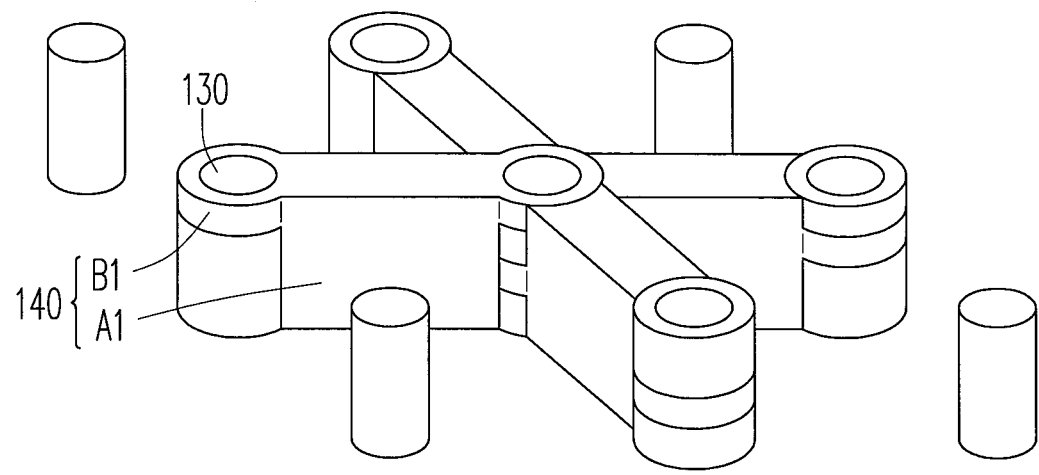
FIGS. 7A-7D are schematic diagrams showing different assembling states of the plates and the raised posts according to an embodiment of the disclosure.

FIGS. 7A-7D are schematic diagrams showing different assembling states of the plates and the raised posts according to an embodiment of the disclosure. In the embodiment of FIG. 7A, similar to the embodiment of FIGS. 4A and 4B, the heights of the bushing portions B1 of the four plates 140 relatively to the bottom of the plate body A1 are different from each other, so that the plates 140A and 140B matched on the same raised post 130 can function in association with each other.

Figure 7B:
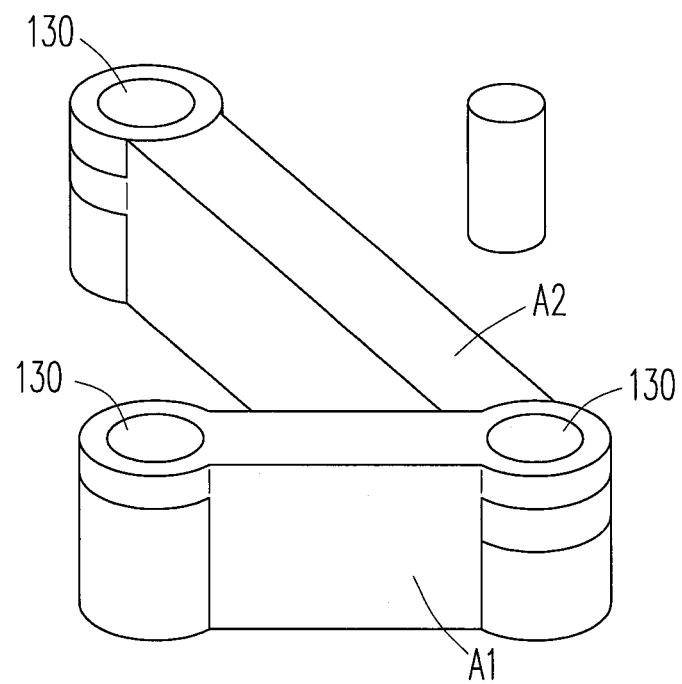

In the embodiment of FIG. 7B, the unique from the embodiments is that the plates have different plate body lengths (transverse length of the plate body A1 is different from the transverse length of the plate body A2) so that the plate bodies A1 and A2 can be assembled to adapt the different distances between the raised posts 130.

Figure 7C:
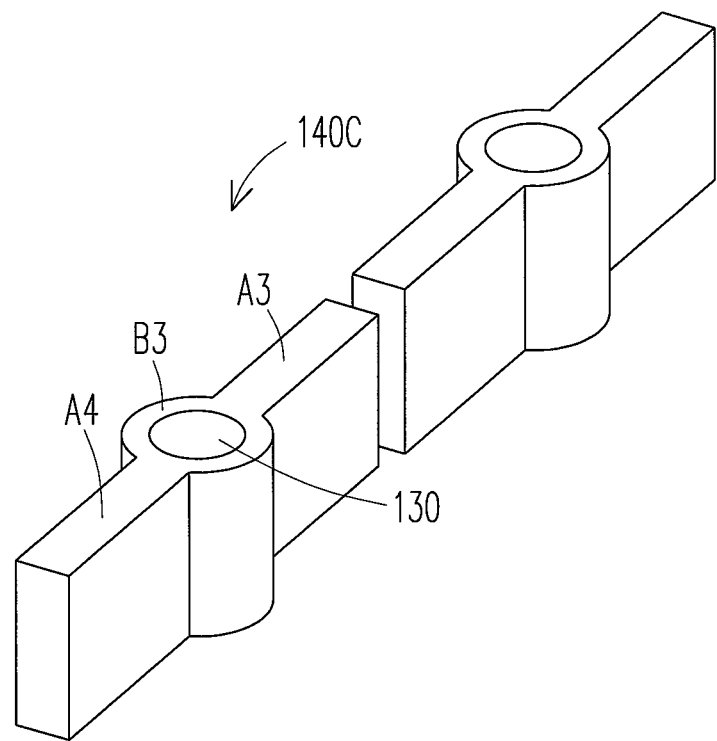
Figure 7D:
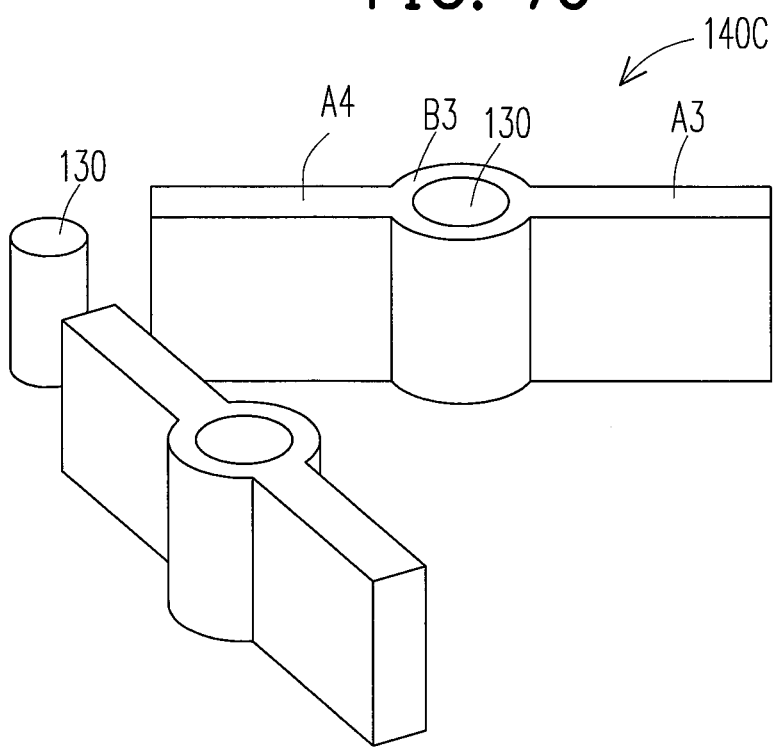

In the embodiments of FIGS. 7C and 7D, the plate 140C has a bushing portion B3 and two plate bodies A3 and A4 at the two opposite sides of the bushing portion B3, in which the bushing portion B3 bushes the raised post 130 to make the plate bodies A3 and A4 located between the raised post 130 and an adjacent raised post 130. In this way, the disclosure provides a different type of the plate 140C from the above-mentioned ones, and such plates can be also used in association with each other or can be used in association with the plates 140A and 140B.

Figure 8A:
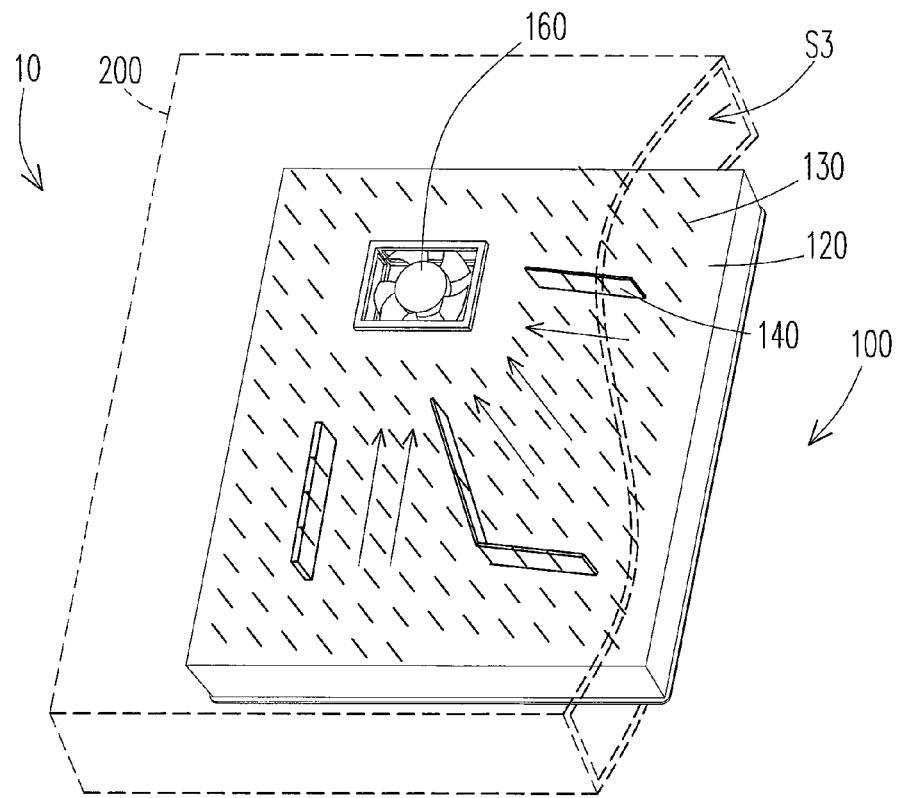
FIG. 8A is a schematic diagram of an electronic apparatus according to third embodiment of the disclosure.
Figure 8B:
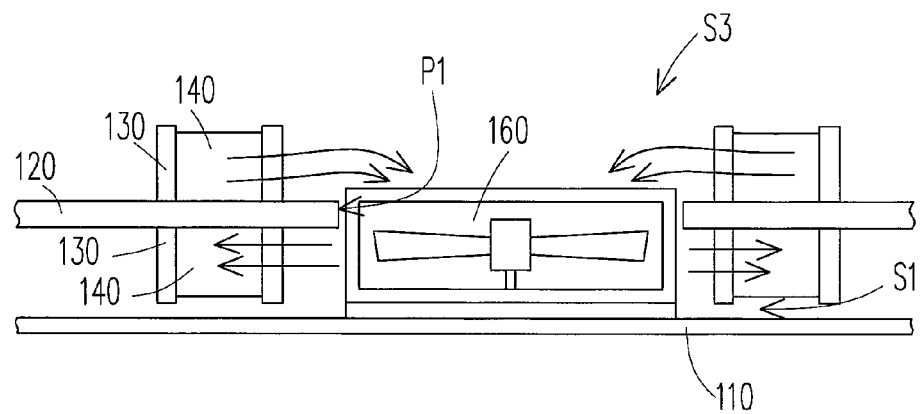
FIG. 8B is a local cross-sectional diagram from FIG. 8A.

FIG. 8A is a schematic diagram of an electronic apparatus according to third embodiment of the disclosure and FIG. 8B is a local cross-sectional diagram from FIG. 8A. Referring to FIGS. 8A and 8B, the arrows between raised posts represent the air flowing direction in the space. In the embodiment, the electronic apparatus 10 is, for example, a computer device and includes a chassis 200 and a motherboard module 100 disposed therein. The motherboard module 100 is described in the above-mentioned embodiments, which is omitted to describe. The unique from the above-mentioned embodiments is that a third space S3 is formed between the cover 120 and the chassis 200, and the raised posts 130 and the plates 140 can be optionally disposed in the third space S3. In other words, the raised posts 130 and the plates 140 can be substantially disposed on the two opposite surfaces of the cover 120 to achieve partitioning space effect, and the raised posts 130 and the plates 140 disposed in the first space S1 are omitted to describe.

In the embodiment, a fan 160 is disposed on the motherboard 110 and partially goes through the opening P1. That is to say, the inlet of the fan 160 is located in the third space S3 and the outlet thereof is located in the first space S1. The raised posts 130 and the plates 140 located in the third space S3 are used in association with each other to form multiple baffle structures. In this way, the air in the third space S3 can flow into the fan 160 along the channels formed by the baffle structures. In the same way, the plates 140 can detachably bush the raised posts 130, so that the user can allow the cool air in the third space S3 flowing into the fan 160 along the formed channels according to the internal space layout of the electronic apparatus 10, which thereby can dissipate heat on the electronic components in the cover 120.

In the embodiment, the kind and the type of the plates to form the baffle structure are not limited by the disclosure. The user can use the corresponding raised posts and plates modified by the user self from the above-mentioned embodiments to form desired channels of the cooling air-flow or the baffles to isolate the heat transmission in modular design.

In summary, in the motherboard module and the electronic apparatus using the same of the above-mentioned embodiments, by using the raised posts disposed in the first space and the plates detachably assembled on the raised posts, a plurality of air flowing channels or baffles for isolating the heats of the heat sources are formed on the cover. The plates and the raised posts can guide the cooling air-flow to the electronic components to be cooled and restrict the heat generated by the heat sources at different limited areas, which is advantageous for the cooling air-flow to cool the heat sources and the motherboard module thereby has better cooling performance.

Since the plates are detachable ones, the user is able to form different combinations of the air channels or heat-isolating baffles corresponding to the application environments of the motherboard module by user self, which allows the motherboard module and the electronic apparatus using the same to have proper and corresponding cooling effects according to the running thereof and expands the adaptation of the motherboard module.

It will be apparent to those skilled in the art that the descriptions above are several preferred embodiments of the disclosure only, which does not limit the implementing range of the disclosure. Various modifications and variations can be made to the structure of the disclosure without departing from the scope or spirit of the disclosure. The claim scope of the disclosure is defined by the claims hereinafter.

What is claimed is:

1. A motherboard module, comprising:
    a motherboard, having a plurality of electronic components;
    a cover, having a plurality of openings to expose the electronic components out of the cover through the openings, wherein when the cover covers the motherboard thereon, a first space is formed between the cover and the motherboard, and the electronic components are installed onto the motherboard through the openings;
    a plurality of raised posts, disposed in the first space; and
    a plurality of plates, detachably assembled between the raised posts and partitioning the first space into a plurality of second spaces.

2. The motherboard module as claimed in claim 1, wherein each of the plates has a plate body and two bushing portions at two opposite sides of the plate body, and the bushing portions are configured to bush any two adjacent raised posts of the plurality of raised posts.

3. The motherboard module as claimed in claim 2, wherein one of the two bushing portions of a first one of the plurality plates and one of the two bushing portions of a second one of the plurality plates have different heights relative relatively to the plate body of the first one and the second one of the plurality of plates, such that different the first one and the second one of the plurality of plates function in association with each other while the first one and the second one of the plurality of plates being bushed on a same raised post of the plurality of raised posts.

4. The motherboard module as claimed in claim 3, wherein the plate body of a first one and a second one of the plurality of plates bodies of the different plates have different lengths to adapt to different distances between the two adjacent raised posts while the bushing portion of the first one and second one of the plurality of portions of the different plates being bushed on the same raised post.

5. The motherboard module as claimed in claim 1, wherein each of the plates has a bushing portion and two plate bodies at different sides of the bushing portion.

6. The motherboard module as claimed in claim 5, wherein the bushing portion bushes a one of the raised posts, so that the two plate bodies are located between the one of the raised posts and other adjacent raised posts of the plurality of raised posts, wherein an angle is included between the plate bodies.

7. The motherboard module as claimed in claim 1, further comprising a fan disposed on the motherboard.

8. The motherboard module as claimed in claim 1, wherein the raised posts are disposed on the cover in an array arrangement.

9. The motherboard module as claimed in claim 1, wherein the raised posts are disposed on the motherboard in an array arrangement.

10. An electronic apparatus, comprising:
    a chassis;
    a motherboard module, disposed in the chassis and comprising:
    a motherboard, having a plurality of electronic components;
    a cover, having a plurality of openings to expose the electronic components, wherein when the cover covers the motherboard thereon, a first space is formed between the cover and the motherboard, and a third space is formed between the cover and the chassis, and the electronic components are installed onto the motherboard through the openings;
    a plurality of raised posts, disposed and arrayed in the first space; and
    a plurality of plates, detachably assembled between the raised posts and partitioning the first space into a plurality of second spaces.

11. The electronic apparatus as claimed in claim 10, further comprising a fan disposed on the motherboard.

12. The electronic apparatus as claimed in claim 10, wherein each of the plates has a plate body and two bushing portions at two opposite sides of the plate body, and the bushing portions are configured to bush any two adjacent raised posts of the plurality of raised posts.

13. The electronic apparatus motherboard module as claimed in claim 12, wherein one of the two bushing portions of a first one of the plurality plates and one of the two bushing portions of a second one of the plurality plates have different heights relative relatively to the plate body of the first one and the second one of the plurality of plates, such that different the first one and the second one of the plurality of plates function in association with each other while the first one and the second one of the plurality of plates being bushed on a same raised post of the plurality of raised posts.

14. The electronic apparatus motherboard module as claimed in claim 13, wherein the plate body of a first one and a second one of the plurality of plates bodies of the different plates have different lengths to adapt to different distances between the two adjacent raised posts while the bushing portion of the first one and second one of the plurality of portions of the different plates being bushed on the same raised post.

15. The electronic apparatus as claimed in claim 10, wherein each of the plates has a bushing portion and two plate bodies at different sides of the bushing portion.

16. The electronic apparatus motherboard module as claimed in claim 15, wherein the bushing portion bushes a one of the raised posts, so that the two plate bodies are located between the one of the raised posts and other adjacent raised posts of the plurality of raised posts, wherein an angle is included between the plate bodies.

17. The electronic apparatus as claimed in claim 10, wherein the raised posts are disposed on the cover in an array arrangement.

18. The electronic apparatus as claimed in claim 10, wherein the raised posts are disposed on the motherboard in an array arrangement.

* * * * *